(12) United States Patent
Chang

(10) Patent No.: US 6,794,313 B1
(45) Date of Patent: Sep. 21, 2004

(54) OXIDATION PROCESS TO IMPROVE POLYSILICON SIDEWALL ROUGHNESS

(75) Inventor: Ming-Ching Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/251,327

(22) Filed: Sep. 20, 2002

(51) Int. Cl.[7] .............................................. H01L 21/31
(52) U.S. Cl. ...................... 438/770; 438/669; 438/595
(58) Field of Search ............................ 438/669, 689, 438/770, 595

(56) References Cited

U.S. PATENT DOCUMENTS

| | | | |
|---|---|---|---|
| 5,548,132 A | | 8/1996 | Batra et al. .................... 257/66 |
| 5,612,249 A | | 3/1997 | Sun et al. ...................... 437/69 |
| 5,712,208 A | * | 1/1998 | Tseng et al. ................. 438/770 |
| 5,776,821 A | * | 7/1998 | Haskell et al. ............... 438/585 |
| 5,879,975 A | | 3/1999 | Karlsson et al. ............. 438/162 |
| 5,902,125 A | | 5/1999 | Wu ............................... 438/300 |
| 5,942,792 A | * | 8/1999 | Miyoshi ...................... 257/636 |
| 6,156,629 A | * | 12/2000 | Tao et al. ..................... 438/535 |
| 6,200,887 B1 | | 3/2001 | Balasubramaniam et al. ..... 438/585 |
| 6,221,746 B1 | | 4/2001 | Huang et al. ................ 438/592 |
| 6,235,650 B1 | * | 5/2001 | Yao .............................. 438/786 |
| 6,483,146 B2 | * | 11/2002 | Lee et al. .................... 257/317 |
| 6,501,141 B1 | * | 12/2002 | Leu ............................. 257/413 |
| 6,506,670 B2 | * | 1/2003 | Schoenborn ................. 438/592 |
| 6,525,384 B2 | * | 2/2003 | Hu et al. ..................... 257/411 |
| 6,541,339 B1 | * | 4/2003 | Lin et al. .................... 438/266 |

\* cited by examiner

*Primary Examiner*—Amir Zarabian
*Assistant Examiner*—Pamela E Perkins
(74) *Attorney, Agent, or Firm*—Haynes and Boone, LLP

(57) ABSTRACT

A new step is provided for the creation of polysilicon gate electrode structures. A layer of polysilicon is deposited over the surface of a layer of semiconductor material, the layer of polysilicon is etched using a layer of hardmask material for this purpose. The etch of the layer of polysilicon is performed using a dual power source plasma system. During the etching of the layer of polysilicon, a step of inert oxidation is inserted. This step forms a layer of passivation over the sidewalls of the etched layer of polysilicon. The step of inert oxidation is an oxygen-based plasma exposure.

48 Claims, 3 Drawing Sheets

OXIDATION PROCESS TO IMPROVE POLYSILICON SIDEWALL ROUGHNESS

BACKGROUND OF THE INVENTION (1) Field of the Invention

The invention relates to the fabrication of integrated circuit devices, and more particularly, to a method for the improvement of sidewalls roughness of a polysilicon gate electrode.

(2) Description of the Prior Art

Conventional methods of creating a gate electrode are well known in the art. The process conventionally starts with the creation of a layer of gate dielectric or pad oxide over the surface of a substrate, a layer of gate material typically comprising polysilicon is deposited over the layer of pad oxide. To provide the deposited layer of polysilicon with a desired level of conductivity, the layer of polysilicon can be in-situ doped with impurity. To further reduce the resistance of the layer of doped polysilicon, the surface of the patterned and etched layer of polysilicon is salicided creating for instance a layer of tungsten silicide over the surface of the layer of polysilicon. The deposited layer of polysilicon is patterned and etched using methods of photolithographic patterning after which Reactive Ion Etching (RIE) removes excess polysilicon in accordance with a photoresist mask. The etching of the layer of polysilicon creates a layer of polysilicon having sidewalls, these sidewalls have a degree of roughness that is determined by the grain structure of the polysilicon at the time that the RIE is applied. For increasingly reduced device dimensions, the grain size of the etched layer of polysilicon that is exposed in the sidewalls of the etched polysilicon has a negative impact on device performance since the grain size approaches the device line width. The relatively poor control that is achieved in this manner of the Critical Dimension of the polysilicon gate has a negative effect on critical gate performance parameters such as the gate threshold voltage ($V_t$) and the drain saturation current ($I_{dsat}$). One of the solutions that have been applied to solve this concern is the use of amorphous silicon as part of the structure of the layer of gate material. This solution however, although it results in improved smoothness of the sidewalls of the created gate structure, leads to polysilicon depletion resulting in increased gate polysilicon capacitance and increased threshold voltage.

Methods have been provided for the creation of gate electrodes such as first etching a layer of polysilicon and then applying an anisbtropic etch to remove the undesirable rough outer surface of the sidewalls of the gate electrode. This anisotropic etch however results in a tapered gate profile which is not desirable. Another approach is to initially reduce the grain size of the applied layer of polysilicon by using a pre-amorphizing impurity implantation. The above referred to method of using both polysilicon and amorphized silicon for the creation of a gate electrode has also been explored in the art.

All of these methods however are typically cumbersome and expensive to implement or have unacceptable side effects such as creating undesirable gate profiles. A simple method is therefore required that removes the effect of surface granularity in the sidewalls of patterned and etched layers of polysilicon. The invention provides such a method by providing a step of oxidation as part of the process of creating a gate electrode of polysilicon.

U.S. Pat. No. 6,221,746 B1 (Huang et al.) shows a poly gate process with an anneal to produce smooth poly sidewalls.

U.S. Pat. No. 5,612,249 (Sun et al.) reveals a gate process with an oxide spacer on the poly gate sidewall.

U.S. Pat. No. 5,902,125 (Wu) and U.S. Pat. No. 5,897,975 (Karlsson et al.) are related gate patents.

U.S. Pat. No. 5,548,132 (Batra et al.) shows a smooth poly gate with small grains.

U.S. Pat. No. 6,200,887 B1 (Balasubramaniam et al.) shows a method to form a smooth poly gate sidewalls.

SUMMARY OF THE INVENTION

A principle objective of the invention is to create a polysilicon gate electrode having smooth sidewalls by amorphizing the sidewalls of the gate electrode structure.

Another objective of the invention is to create a polysilicon gate electrode having smooth sidewalls whereby the gate material is not subject to effects of gate depletion.

Yet another objective of the invention is to create a polysilicon gate electrode having smooth sidewalls for gate electrodes having sub-micron and deep sub-micron device feature size.

A still further objective of the invention is to improve Critical Dimension control of a polysilicon gate electrode having sub-micron and deep sub-micron device feature size.

In accordance with the objectives of the invention a new step is provided for the creation of polysilicon gate electrode structures. A layer of polysilicon is deposited over the surface of a layer of semiconductor material, the layer of polysilicon is etched using a layer of hardmask material for this purpose. The etch of the layer of polysilicon is performed using a dual power source plasma system. During the etching of the layer of polysilicon, a step of inert oxidation is inserted, this step forms a layer of passivation over the sidewalls of the etched layer of polysilicon. The step of inert oxidation is an oxygen-based plasma exposure.

DESCRIPTION OF THE PREFERRED EMBODIMENTS

To further highlight some of the problems that can be experienced in patterning and etching a layer of polysilicon, this process will first be briefly highlighted.

The process typically starts with the creation of a layer of gate or pad oxide over the surface of a silicon substrate, a layer of polysilicon is deposited over the created layer of gate oxide. To reduce gate electrode resistance, the surface of the layer of polysilicon is salicided by depositing a layer of for instance tungsten over the surface of the layer of polysilicon. The structure is exposed to high temperature environment for the creation of tungsten silicide as a top surface layer over the layer of polysilicon. The layer of polysilicon, including the thereover created layer of tungsten silicide, can now be patterned and etched. Prior to this patterning and etching of the salicided layer of polysilicon, a layer of Anti-Reflective Coating (ARC) and a layer of passivation may be deposited over the salicided surface of the layer of polysilicon. Standard methods of photolithographic exposure and etching are then used to create the desired layer of polysilicon gate material. After the etching process has been completed, a conventional step of gate etch anneal is applied to restore the etching damage that has been introduced in the sidewalls of the layer of polysilicon, this etch anneal creates a layer of sidewalls oxide over the sidewalls of the etched layer of polysilicon.

The invention provides for a new and improved method of creating a layer of sidewall oxide by inserting a step of oxidation, defined as an oxygen-based plasma exposure, into the conventional sequence of steps of processing a layer of polysilicon for the formation of a gate electrode. This process will now be described in detail.

Figure 1:
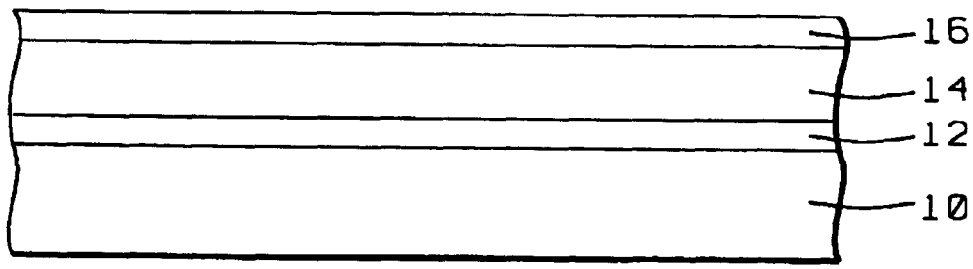
FIG. 1 shows a cross section of a semiconductor substrate over the surface of which have successively been created a layer of gate oxide, a layer of gate material and a layer of hardmask material.

Referring for this purpose first to the cross section that is shown in FIG. 1, there are shown the initial steps that are performed by the invention, as follows:

10, the invention starts with providing a silicon substrate, preferably a monocrystalline silicon 12, a layer of gate oxide formed over the surface of substrate 10

14, a layer of gate material, preferably comprising polysilicon, deposited over the surface of the layer 12 of gate oxide, and 16, a layer of hardmask material deposited over the surface of the layer 14 of polysilicon.

Layer 12 of gate oxide is usually formed as a silicon dioxide material but may be a composite oxide, such as TEOS and silicon dioxide, or a nitride oxide layer or a like gate dielectric. The gate oxide layer 12 can be silicon dioxide, thermally grown in an oxygen-steam ambient at a temperature between 800 and 1,000 degrees C. to a thickness of about 30 to 300 Angstrom. Alternatively, other methods of oxidation can be used for the creation of layer 12 of gate oxide, such as oxidation in a dry oxygen and anhydrous hydrogen chloride in an atmospheric or low pressure environment, or in a low temperature, high pressure environment and the like. As examples of the creation of layer 12 of gate oxide can be cited applying dry or wet oxidation with a $NH_4/N_2O$ anneal at a temperature between about 650 and 950 degrees C. Layer 12 of gate oxide can also be grown by Rapid Thermal Oxidation (RTO) of the surface of substrate 10 at a temperature between about 400 and 1,000 degrees C.

Layer 14 of polysilicon can be deposited to a thickness between about 200 and 5,000 Angstrom. The layer 14 of polysilicon can be deposited using methods of LPCVD at a temperature of between about 500 and 650 degrees C. The polysilicon layer 14 can be grown using in situ doping procedures by doping with arsenic or phosphine in a saline ambient. The polysilicon layer 14 can also be deposited intrinsically and doped via impurity ion implant of arsenic or phosphorous, at an energy of about 30 to 75 KeV and a concentration between about 5E14 and 1E16 atoms/cm$^2$. Specifically and as examples, layer of 14 of polysilicon can be doped as follows:

for NMOS devices: N+ doped using As or P as a dopant with a dopant dose of between about $1 \times 10^{14}$ and $1 \times 10^{16}$ atoms/cm$^2$ for PMOS devices: P+ doped using $BF_2$ or B as a dopant with a dopant dose of between about $1 \times 10^{14}$ and $1 \times 10^{16}$ atoms/cm$^2$.

Layer 14 of gate material may also comprise polysilicon germanium and may be deposited as indicated above including therein the highlighted impurity doping to establish a desired level of conductivity.

The term "hard mask" material is known in the art as referring to an inorganic masking material. The layer 16 of hard mask is preferably of silicon dioxide obtained from TEOS. The TEOS is deposited by CVD or PECVD to a thickness of about 100 to about 1,000 Angstrom and more typically to a thickness between about 400 and 600 Angstrom. The TEOS is reacted with oxygen or ozone to provide the silicon oxide hard mask material. Other less preferred hard mask materials include phosphosilicate glass (PSG), borophosphosilicate (BPSI), silicon oxynitride and thermally grown silicon dioxide.

Figure 2:
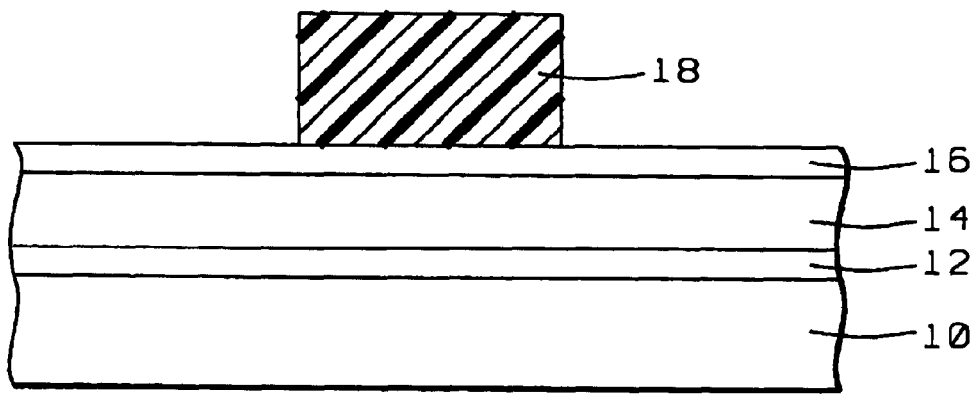
FIG. 2 shows a cross section after a photoresist mask has been created over the surface of the layer of hardmask material.

FIG. 2 shows a cross section after a mask 18 of photoresist has been formed over the surface of layer 16 of hardmask material. Layer 18 of photoresist has been patterned and developed, creating a layer 18 over the surface of layer 16 that shields the surface of the layer 16 in accordance with a pattern of the to be created polysilicon gate electrode.

Layer 18 of photoresist can be deposited or laminated to a thickness of between about 2,000 and 8,000 Angstrom. The methods used for the deposition or lamination and development of the layer 18 of photoresist apply conventional methods of photolithography, whereby patterned layers are usually formed by spinning or by laminating of a layer of photoresist, projecting light through a photomask with the desired pattern onto the photoresist to expose the photoresist to the pattern, developing the photoresist, washing off the unexposed photoresist, and plasma etching to clean out the areas where the photoresist has been washed away. The exposed resist may be rendered insoluble (negative working) and form the pattern, or soluble (positive working) and be washed away.

Layer 18 of photoresist can be etched by applying $O_2$ plasma and then wet stripping by using a $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual-free removal of highly postbaked resist. They are more effective than organic strippers and the longer the immersion time, the cleaner and more residue free wafer surface can be obtained.

The photoresist layer 18 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Layer 18 of photoresist can additionally be cured after the layer of photoresist has been deposited and before the layer of photoresist is patterned and developed. This curing of the layer of photoresist can be performed in a $N_2$ gas ambient, at a temperature of between about 300 and 400 degrees C., for a time period between about 1.5 and 2.5 hours, and a pressure of 760 Torr.

Figure 3:
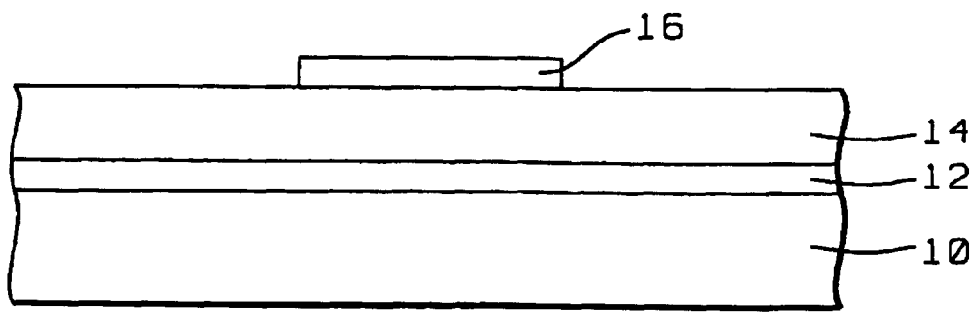
FIG. 3 shows a cross section after the layer of hardmask material has been etched in accordance with the photoresist mask, the photoresist mask has then been removed.

FIG. 3 shows a cross section after layer 16 of hardmask material has been etched in accordance with the photoresist mask 18 that is shown in cross section in FIG. 2. Types of etchants used for hard masks include $CF_4$, $CHF_3$, $C_3F_8$, $C_2H_6$ and $SF_6$, with dilutants such as Argon of Helium.

The photoresist mask 18 has been removed from the surface of the patterned and etched layer 16 of hardmask material after this layer has been etched as shown in cross section in FIG. 3. For the removal of the photoresist mask 18 plasma oxygen ashing and careful wet clean can be applied.

Figure 4:
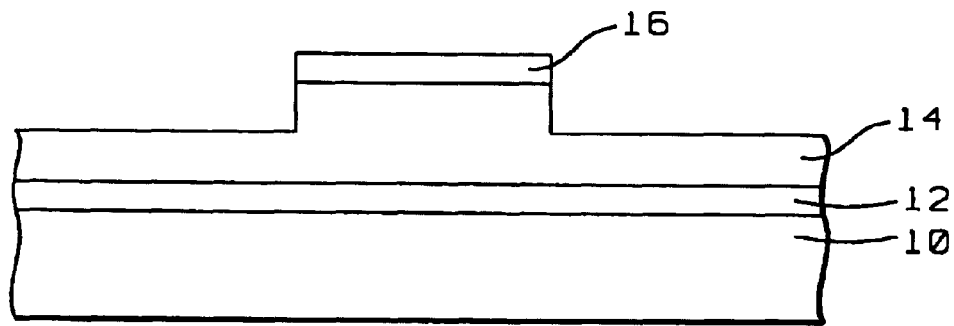
FIG. 4 shows a cross section after the layer of gate material has been partially etched in accordance with the pattern of the layer of hardmask material.

FIG. 4 shows a cross section after the layer 14 of polysilicon has been partially etched in accordance with the pattern of the hardmask layer 16.

The etching of layer 14 of polysilicon can be accomplished by using an anisotropic plasma etch, for example a Reactive Ion Etch (RIE), using as etchant gasses a gas such as hydrogen bromide (HBr) or chlorine ($Cl_2$) and a carrier gas such as argon At this time in the processing sequence of the invention, that is after completion of the partial etch of layer 14 of polysilicon as shown in cross section in FIG. 4, a step of oxygen-based plasma exposure is inserted into the conventional processing stream as an extension of the step of etching layer 14, using the Dual Power Plasma System for this step of plasma exposure that has been used for the etching of layer 14.

Figure 5:
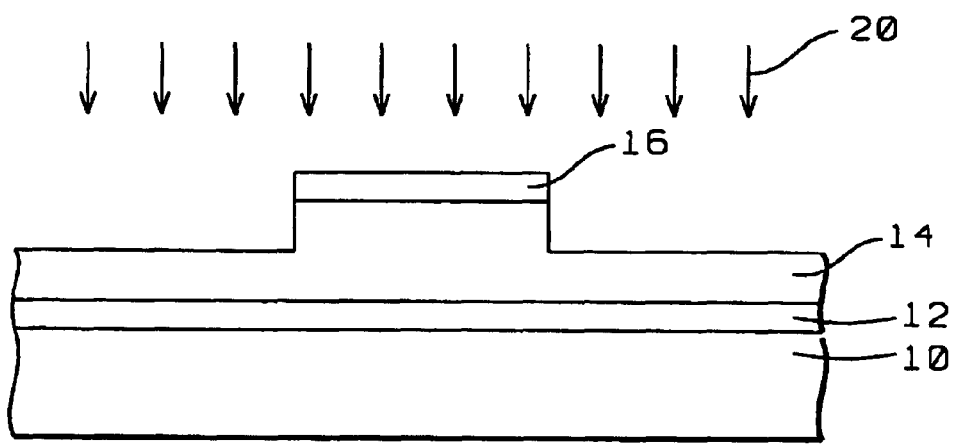
FIG. 5 shows a cross section at the time that an oxygen-based plasma treatment is initiated during the process of etching the layer of gate material.

The consequential step of oxygen-based plasma treatment 20, FIG. 5, of the exposed sidewalls of the created layer of polysilicon is performed at a temperature of between about 180 and 210 degrees C. for a time between about 12 and 13 minutes. The plasma process is performed at a power of about 500 Watt, a pressure of about 800 mTorr, using $O_2$ as a source at a flow rate of about 500 sccm for about 15 minutes. When the temperature rises above about 80 degrees C., the plasma is turned on, the temperature stabilizes after about 2 and 3 minutes.

Figure 6:
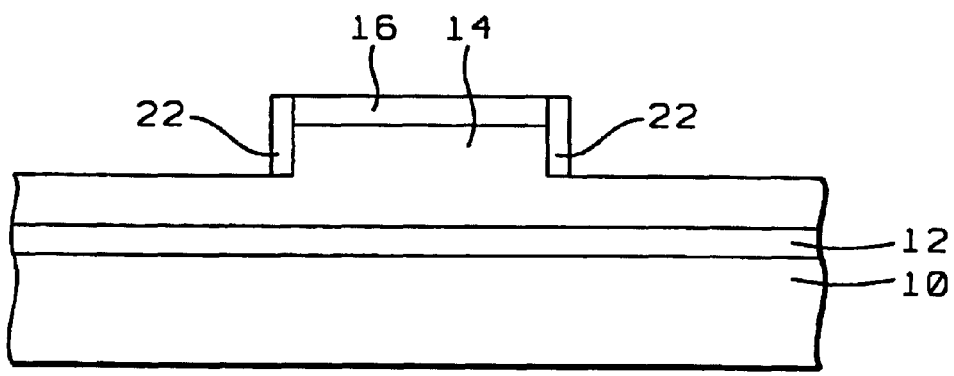
FIG. 6 shows a cross section of the layer of oxide that is formed over the sidewalls of the partially etched layer of gate material.

The results of the oxygen-based plasma treatment 20 can be seen in the cross section shown in FIG. 6. Layers 22 of oxide have been formed over sidewalls of the partially etched layer 14.

Figure 7:
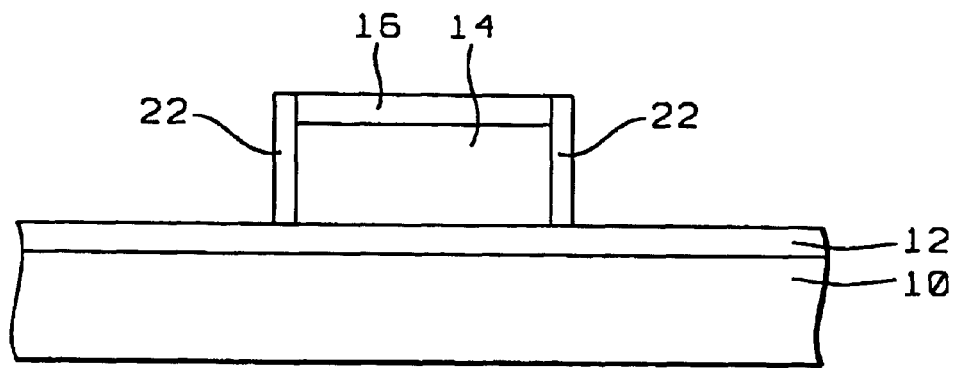
FIG. 7 shows a cross section after the layer of gate material has been etched, a layer of oxide has been formed over the sidewalls of the etched layer of gate material.

Both the etch of layer 14 of polysilicon and the therewithin inserted oxygen-based plasma treatment 20 continue simultaneously to the point where layer 14 has essentially been etched down to the surface of layer 12 of gate oxide, as shown in cross section in FIG. 7. It must thereby be realized that, during this simultaneous process of etch and oxygen-based plasma exposure, the creation of layer 22 shown in cross section in FIG. 6 continues over the now progressively further exposed sidewalls of the to be created patterned and etched layer of gate material, resulting in a cross section that is shown in FIG. 7. From this cross section it is clear that complete and uninterrupted layers 22 of oxide have been formed over the sidewalls of the patterned and etched layer 14 of polysilicon.

The gate electrode is now completed with the removal of the exposed layer 12 of gate oxide.

The gate oxide 12 can be removed by dipping the specimen in slope, a chemical compound containing HF, BOE, DI water and $CH_3COOH$, for the duration of between about 3 and 5 seconds. The ratio in which the slope ingredients are preferably mixed is as follows: HF:BOE:DI WATER:$CH_3COOH$=1:15:3:10. The etch is preferably and of significance to the invention performed using a Dual Power Plasma System which allows for a continuous and uninterrupted step of applying the subsequent step of oxidation.

Figure 8:
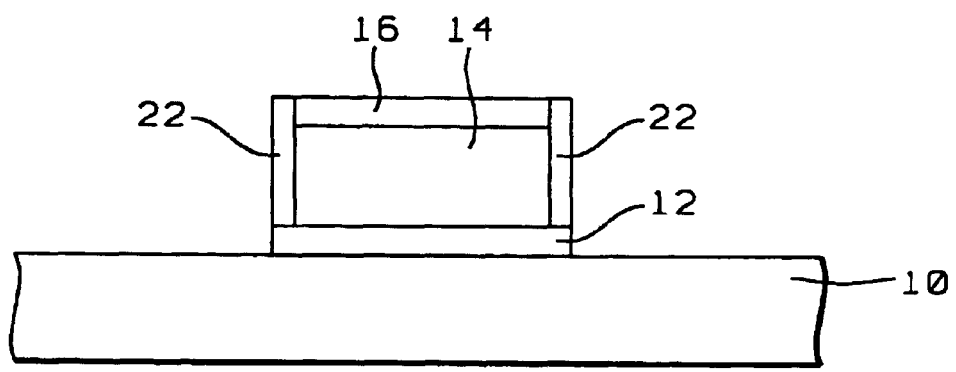
FIG. 8 shows a cross section after the layer of gate oxide has been etched using the gate electrode as a mask.
Figure 9:
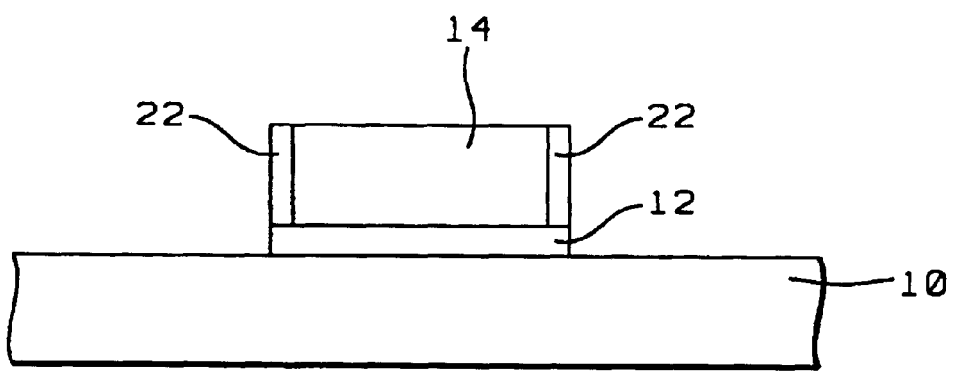
FIG. 9 shows a cross section after the layer of hardmask material has been removed from the surface of the gate electrode.

After the gate oxide has been removed in accordance with the patterned layer 14 of polysilicon and the created layers 22 of oxide, as shown in the cross section of FIG. 7, the cross section that is shown in FIG. 8 is obtained.

As a final step the layer 16 of hardmask material may be removed from the patterned layer 14 of polysilicon, creating a polysilicon gate electrode 12/14 over the sidewalls of which have been created protective and surface smoothing layers 22 of oxide. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modificatiions which fall within the scope of the appended claims and equivalents thereof.

What is claimed is:

1. A method of reducing surface roughness of sidewalls of a created gate electrode, comprising steps of:
   providing a semiconductor substrate;
   forming a layer of gate electrode material over said substrate;
   initiating and partially completing etching said layer of gate electrode material; then
   initiating a step of oxidation of said partially etched layer of gate electrode material; and
   continuing and completing patterning said layer of gate electrode material.

2. The method of claim 1, additionally removing a layer of gate oxide using said patterned layer of gate electrode material as a mask.

3. The method of claim 2, said layer of gate oxide comprising silicon dioxide.

4. The method of claim 3, said silicon dioxide being thermally grown in an oxygen-steam ambient at a temperature between 800 and 1,000 degrees C. to a thickness of between about 30 to 300 Angstrom.

5. The method of claim 2, wherein said layer of gate oxide is a composite oxide.

6. The method of claim 2, said layer of gate oxide being created by oxidation in a dry oxygen and anhydrous hydrogen chloride in an atmospheric or low pressure environment.

7. The method of claim 2, said layer of gate oxide being created by applying dry or wet oxidation with a $NH_4/N_2O$ anneal at a temperature between about 650 and 950 degrees C.

8. The method of claim 2, said layer of gate oxide being created by Rapid Thermal Oxidation (RTO) of the surface of said substrate at a temperature between about 400 and 1,000 degrees C.

9. The method of claim 1, additionally removing a patterned layer of hardmask material from said patterned layer of gate electrode material.

10. The method of claim 9, said hardmask material comprising silicon dioxide obtained from TEOS, said TEOS being deposited by CVD or PECVD to a thickness of about 100 to about 1,000 Angstrom.

11. The method of claim 1, said gate electrode material comprising polysilicon.

12. The method of claim 11, said polysilicon being deposited to a thickness between about 200 and 5,000 Angstrom.

13. The method of claim 1, said step of oxidation comprising an oxygen based plasma exposure.

14. The method of claim 13, said oxygen based plasma exposure comprising applying a temperature of between about 180 and 210 degrees C. for a time between about 12 and 13 minutes, performed at a power of about 500 Watt, a pressure of about 800 mTorr, using $O_2$ as a source at a flow rate of about 500 sccm for about 15 minutes, said plasma being activated when the temperature rises above about 80 degrees C.

15. The method of claim 1, said etching said layer of gate electrode material and said oxidation being performed in a dual power source plasma system.

16. The method of claim 1, said gate material comprising polysilicon germanium.

17. The method of claim 16, said polysilicon germanium being deposited to a thickness between about 200 and 5,000 Angstrom.

18. The method of claim 1, said forming a layer of gate electrode material over said substrate comprising steps of:
successively creating over said substrate first a layer of gate oxide over which a layer of gate electrode material is deposited over which a layer of hardmask material is deposited; and
patterning said layer of hardmask material, creating an etch mask for etching said layer of gate electrode material.

19. The method of claim 1, said continuing and completing patterning said layer of gate electrode material comprising concurrently continuing said step of oxidation, creating an etched layer of gate electrode material over sidewalls of which a layer of oxide has been deposited.

20. A method of reducing surface roughness of sidewalls of a gate electrode, comprising steps of:
providing a semiconductor substrate, said substrate having been provided with first a layer of gate electrode oxide over the surface thereof over which second a layer of gate electrode material has been deposited over which third a mask of hardmask material has been created;
initiating and partially completing etching said layer of gate electrode material in accordance with said mask of hardmask material using a dual power source plasma system; then
initiating a step of oxidation using said dual power source plasma system; and
continuing and completing etching said layer of gate electrode material while concurrently continuing said step of oxidation, creating an etched layer of gate electrode material over sidewalls of which a layer of oxide has been deposited.

21. The method of claim 20, additionally removing said layer of gate oxide using said etched layer of gate electrode material and said mask of hardmask material as a mask.

22. The method of claim 20, additionally removing said mask of hardmask material.

23. The method of claim 20, said gate electrode material comprising polysilicon.

24. The method of claim 23, said polysilicon being deposited to a thickness between about 200 and 5,000 Angstrom.

25. The method of claim 20, said step of oxidation comprising an oxygen based plasma exposure.

26. The method of claim 25, said oxygen based plasma exposure comprising applying a temperature of between about 180 and 210 degrees C. for a time between about 12 and 13 minutes, performed at a power of about 500 Watt, a pressure of about 800 mTorr, using $O_2$ as a source at a flow rate of about 500 sccm for about 15 minutes, said plasma being activated when the temperature rises above about 80 degrees C.

27. The method of claim 20, said hardmask material comprising silicon dioxide obtained from TEOS, said TEOS being deposited by CVD or PECVD to a thickness of about 100 to about 1,000 Angstrom.

28. The method of claim 20, said gate electrode material comprising polysilicon germanium.

29. The method of claim 28, said polysilicon germanium being deposited to a thickness between about 200 and 5,000 Angstrom.

30. The method of claim 20, said layer of gate oxide comprising silicon dioxide.

31. The method of claim 30, said silicon dioxide being thermally grown in an oxygen-steam ambient at a temperature between 800 and 1,000 degrees C. to a thickness of between about 30 to 300 Angstrom.

32. The method of claim 20, wherein said layer of gate oxide is a composite oxide.

33. The method of claim 20, said layer of gate oxide being created by oxidation in a dry oxygen and anhydrous hydrogen chloride in an atmospheric or low pressure environment.

34. The method of claim 20, said layer of gate oxide being created by applying dry or wet oxidation with a $NH_4/N_2O$ anneal at a temperature between about 650 and 950 degrees C.

35. The method of claim 20, said layer of gate oxide being created by Rapid Thermal Oxidation (RTO) of said substrate at a temperature between about 400 and 1,000 degrees C.

36. A method of reducing roughness in sidewalls of a polysilicon gate electrode, comprising steps of:
providing a semiconductor substrate, said substrate having been provided with first a layer of gate oxide over the surface thereof over which second a layer of polysilicon has been deposited over which third a mask of hardmask material has been created;
initiating and partially completing etching said layer of polysilicon in accordance with said mask of hardmask material using a dual power source plasma system;
initiating a step of oxidation using said dual power source plasma system; and
continuing and completing etching said layer of polysilicon while concurrently continuing said step of oxidation, creating an etched layer of polysilicon over sidewalls of which a layer of oxide has been deposited.

37. The method of claim 36, additionally removing said layer of gate oxide using said mask of hardmask material and said etched layer of polysilicon as a mask.

38. The method of claim 36, additionally removing said mask o f hardmask material.

39. The method of claim 36, said layer of polysilicon being deposited to a thickness between about 200 and 5,000 Angstrom.

40. The method of claim 36, said step of oxidation comprising an oxygen based plasma exposure.

41. The method of claim 40, said oxygen based plasma exposure comprising applying a temperature of between about 180 and 210 degrees C. for a time between about 12 and 13 minutes, performed at a power of about 500 Watt, a pressure of about 800 mTorr, using $O_2$ as a source at a flow rate of about 500 sccm for about 15 minutes, said plasma being activated when the temperature rises above about 80 degrees C.

42. The method of claim 36, wherein said hardmask material is silicon dioxide obtained from TEOS, said TEOS being deposited by CVD or PECVD to a thickness of about 100 to about 1,000 Angstrom.

43. A method of reducing surface roughness in sidewalls of a polysilicon gate electrode, comprising steps of:

providing a semiconductor substrate, said substrate having been provided with first a layer of gate oxide over the surface thereof over Which second a layer of polysilicon has been deposited over which third a mask of hardmask material has been created;

initiating and partially completing etching said layer of polysilicon in accordance with said mask of hardmask material using a dual power source plasma system;

initiating a step of oxidation comprising an oxygen based plasma exposure using said dual power source plasma system; and continuing and completing etching said layer of polysilicon while concurrently continuing said step of oxidation, creating an etched layer of polysilicon over sidewalls of which layers of oxide have been deposited.

44. The method of claim 43, additionally removing said layer of gate oxide using said mask of hardmask material and said etched layer of polysilicon as a mask.

45. The method of claim 43, additionally removing said mask of hardmask material.

46. The method of claim 43, said layer of polysilicon being deposited to a thickness between about 200 and 5,000 Angstrom.

47. The method of claim 43, said oxygen based plasma exposure comprising applying a temperature of between about 180 and 210 degrees C. for a time between about 12 and 13 minutes, performed at a power of about 500 Watt, a pressure of about 800 mTorr, using $O_2$ as a source at a flow rate of about 500 sccm for about 15 minutes, said plasma being activated when the temperature rises above about 80 degrees C.

48. The method of claim 43, said hardmask material preferably comprising silicon dioxide obtained from TEOS, said TEOS being deposited by CVD or PECVD to a thickness of about 100 to about 1,000 Angstrom.

* * * * *